(12) United States Patent
Kennedy et al.

(10) Patent No.: US 7,084,010 B1
(45) Date of Patent: Aug. 1, 2006

(54) INTEGRATED PACKAGE DESIGN AND METHOD FOR A RADIATION SENSING DEVICE

(75) Inventors: Adam M. Kennedy, Santa Barbara, CA (US); Michael Bailey, Santa Barbara, CA (US); Edward Meissner, Allen, TX (US); Robert K. Dodds, Santa Barbara, CA (US); David VanLue, Santa Barbara, CA (US)

(73) Assignee: Raytheon Company, Waltham, MA (US)

(*) Notice: Subject to any disclaimer, the term of this patent is extended or adjusted under 35 U.S.C. 154(b) by 145 days.

(21) Appl. No.: 10/688,708

(22) Filed: Oct. 17, 2003

(51) Int. Cl.
*H01L 21/44* (2006.01)
(52) U.S. Cl. ..................... 438/115; 250/346
(58) Field of Classification Search ........... 438/115, 438/121, 125, 64; 250/349, 332, 353, 352, 250/343, 345, 346, 339.14
See application file for complete search history.

(56) References Cited

U.S. PATENT DOCUMENTS

| | | | |
|---|---|---|---|
| 5,397,897 A * | 3/1995 | Komatsu et al. .......... 250/338.4 |
| 5,399,897 A | 3/1995 | Cunningham et al. ...... 257/467 |
| 5,433,639 A | 7/1995 | Zahuta et al. |
| 5,521,123 A * | 5/1996 | Komatsu et al. ............ 438/64 |
| 5,688,699 A | 11/1997 | Cunningham et al. ......... 437/3 |
| 5,708,269 A | 1/1998 | Meissner et al. ............ 350/332 |
| 5,808,350 A | 9/1998 | Jack et al. .................. 257/440 |
| 5,895,233 A | 4/1999 | Higashi et al. ............. 407/107 |
| 5,921,461 A | 7/1999 | Kennedy et al. .......... 228/124.6 |
| 6,043,982 A | 3/2000 | Meissner .................... 361/704 |
| 6,077,046 A | 6/2000 | Kennedy et al. ............. 417/48 |
| 6,122,919 A | 9/2000 | Patel et al. .................. 62/51.1 |
| 6,326,611 B1 | 12/2001 | Kennedy et al. ............ 250/239 |
| 6,413,800 B1 * | 7/2002 | Kyle .......................... 438/115 |
| 6,479,320 B1 | 11/2002 | Gooch |
| 2002/0175284 A1 | 11/2002 | Vilain |

FOREIGN PATENT DOCUMENTS

| | | |
|---|---|---|
| JP | 09 229765 | 1/1998 |
| WO | WO 02/39481 | 5/2002 |

* cited by examiner

*Primary Examiner*—Hoai Pham
*Assistant Examiner*—(Vikki) Hoa B. Trinh
(74) *Attorney, Agent, or Firm*—William C. Schubert; Karl A. Vick

(57) ABSTRACT

A radiation detector (10) has a base (30), a frame (48), a window (46), and solder layers (50, 52) formed from a solder pre-form (58, 60) to define a vacuum chamber (56). Feedthroughs (18, 40, 44) penetrate the base (30) for electrical connection to internal components. A method for sealing the detector (10) aligns a lower detector assembly (62), the frame (48) the window (46), and the solder pre-forms (58, 60) in a non-sealed relation within a processing chamber (80, 94). High temperature and low pressure is imposed, and the getter (42) is activated by resistive heating imposed by current leads (88). The window (46), frame (48), and lower detector assembly (62) are then pressed together and sealed by the liquefied solder pre-forms (58, 60). The method eliminates the need for a seal port, combines several steps within the processing chamber (80, 94), and eliminates certain prior art cleaning steps.

12 Claims, 4 Drawing Sheets

INTEGRATED PACKAGE DESIGN AND METHOD FOR A RADIATION SENSING DEVICE

TECHNICAL FIELD

These teachings relate generally to radiation detectors, housings or packages for such detectors, and methods of making and sealing a vacuum chamber of such detectors. These teachings are particularly applicable to ceramic vacuum packages for thermal detectors such as uncooled infra-red (IR) radiation detectors, but may be applied to metal vacuum package detectors.

BACKGROUND

Manufacturers have developed uncooled IR devices to meet more stringent demands for low weight, compact size, and reduced cost. Uncooled detectors refers to detectors that are not cryogenically cooled, preferably operable within the temperature range of 300 K +/−75 K. There are increasing opportunities to incorporate these uncooled IR detectors into consumer products and electronics, such as automobiles, security devices, medical imaging and the like. Uncooled IR detectors comprise several major components, typically a radiation sensor such as a focal plane array (FPA) that senses incident radiation, a window through which incident radiation passes to the FPA, one or more thermoelectric (TE) cooling elements that remove heat generated by the FPA and incident radiation, a base and sidewalls that, along with the window, define a vacuum chamber that isolates the FPA from the external environment, and a getter that adsorbs or absorbs molecules within the vacuum chamber to prevent package heat transfer to the FPA.

Manufacturing both cooled and uncooled IR detectors remains expensive due to several factors, primarily a multi-step serial process for decontaminating and sealing the detector vacuum chamber. The FPA, typically a heat sensitive resistor, is highly sensitive and responsive to even minute amounts of environmental contamination. Packages are therefore designed to maintain the FPA at very low pressure, typically less than about 50 mTorr, throughout the useful life of the detector. Traditionally, the vacuum chamber was defined by a metal housing made from several components that were sealed using laser or e-beam welders. Metal-body detectors typically include a pinch-off tube extending outside the package that is crimped or otherwise sealed after final evacuation of the vacuum chamber. Ceramic-body detectors now use a solder re-flow process in several steps to seal the detector, leaving only a seal port penetrating into the vacuum chamber once all other components are assembled and sealed. The detector is evacuated by attaching a vacuum pump to the pinch-off tube, or by placing the entire detector into a vacuum chamber. Due to the strict operating requirments imposed by the FPA, proper evacuation of the vacuum chamber often requires hours or days of cycling low pressure and high temperature. Once evacuation is complete, the pinch-off tube or the seal port is sealed.

While the costly traditional metal housing components are being superceded by ceramic housings in more recent designs, final sealing of both metal and ceramic detectors remains a time consuming serial process that raises fabrication costs. The use of solder traditionally adds several steps to the fabrication process due to at least two countervailing factors: difficulty in forming a hermetic soldered seal absent flux, and high probability that solder flux would contaminate the vacuum chamber. Flux is used to improve hermeticity, but it may cause bubbles or voids to form within the soldered seal. Such bubbles may rupture or expand, and either off-gas into the vacuum chamber and contaminate the FPA environment or create pathways that compromise the hermeticity of the vacuum chamber. These potential problems require numerous steps to ensure proper preparation and metallization of surfaces. One fabrication technique for ceramic detectors is to solder the window to a window housing. Since this step may be performed away from the FPA, flux is used to improve hermeticity. Such a soldered window/window housing assembly requires an additional cleaning step to prevent contamination of the FPA during its attachment to the remainder of the detector. When the window/window housing is soldered to the remainder of the detector, only a relatively small seal port remains to evacuate the vacuum chamber of the detector, necessitating long periods within a low pressure processing chamber or attached to a vacuum pump.

FPA sensitivity to environmental contaminants appears to be inseparable from its desirable high field sensitivity, so a low-pressure vacuum chamber continues to be required. What is needed in the art then is a radiation detector package that allows more efficient production methods, especially a detector package that supports lighter and more compact designs. It is an object of this invention to provide such a detector package, as well as a more efficient method for making and finally sealing such a detector package. The advantages of this invention are best realized with uncooled ceramic detectors, but the invention applies also to cryogenically cooled detectors and/or metal-bodied detectors. The description focuses on uncooled ceramic detectors but the claims are not limited to such unless made explicit therein.

SUMMARY OF THE PREFERRED EMBODIMENTS

The foregoing and other problems are overcome, and other advantages are realized, in accordance with the presently preferred embodiments of these teachings.

The preferred embodiment of the present invention is a radiation detector that includes a plurality of housing components that define a vacuum chamber. The housing components include a base, a window, and a first solder layer between the base and the window. An electrical pathway extends through each of a sensor feedthrough and a getter feedthrough. Each feedthrough is defined by at least one of the housing components, and each penetrates from within the vacuum chamber to external of the vacuum chamber. The detector also includes a radiation sensor disposed within the vacuum chamber and in electrical contact with the electrical pathway associated with the sensor feedthrough, and a getter disposed within the vacuum chamber and in electrical contact with the electrical pathway associated with the getter feedthrough.

In a preferred embodiment, the detector also includes a frame that is a separate component from the base and a second solder layer between the base and the frame, wherein the first solder layer is between the frame and the window. This embodiment further includes TE elements within the vacuum chamber and in electrical contact with electrical pathways through TE element feedthroughs. All feedthroughs in the preferred embodiment penetrate the base.

A radiation detector according to the present invention includes at least two outer package components joined by a heat activated sealant material to form a hermetically sealed vacuum chamber, and a plurality of inner components within the hermetically sealed vacuum chamber. Such a detector can be identified as being made by the process of this invention because a pressure within the vacuum chamber is substantially equal to a sealing pressure of the processing chamber, wherein the sealing pressure is that pressure within the processing chamber at the time the outer components were joined therein to form the vacuum chamber.

This invention also encompasses a method for making a radiation detector that includes assembling a lower detector assembly, which in the preferred embodiment of the detector is the base, TE elements, sensor, and getter, with electrical connections within the detector completed. The method further includes enclosing the lower detector assembly, a window, and a first solder entity within a processing chamber so that the window is spaced from the lower detector assembly. Pressure is reduced within the processing chamber, and temperature is increased within the processing chamber. While under low pressure and increased temperature, the method includes maintaining a spaced relation between the window and the lower detector assembly until the first solder entity reaches a melting point. The method further includes moving at least one of the window and the lower detector assembly into contact with one another for forming a hermetically sealed compartment using the first solder entity that is interposed between them. Pressure within the processing chamber is then equalized with pressure immediately outside of the processing chamber, while maintaining the reduced pressure within the hermetically sealed compartment.

A variation on the method for assembly of a radiation detector having an outer package enclosing inner components includes placing radiation detector components within a processing chamber with a heat-activated sealant material disposed between at least two outer package components that are disposed in a spaced-apart fashion from one another. Gas pressure within the processing chamber is reduced, and the temperature within the processing chamber is increased for activating the sealant material. The spaced-apart outer package components are urged into contact for sealing them together using the activated sealant material, and the radiation detector is removed from the chamber. The radiation detector outer package maintains the reduced gas pressure around the internal components after removal from the chamber.

BRIEF DESCRIPTION OF THE DRAWINGS

The foregoing and other aspects of these teachings are made more evident in the following Detailed Description of the Preferred Embodiments, when read in conjunction with the attached Drawing Figures, wherein.

DETAILED DESCRIPTION OF THE PREFERRED EMBODIMENTS

Figure 1:
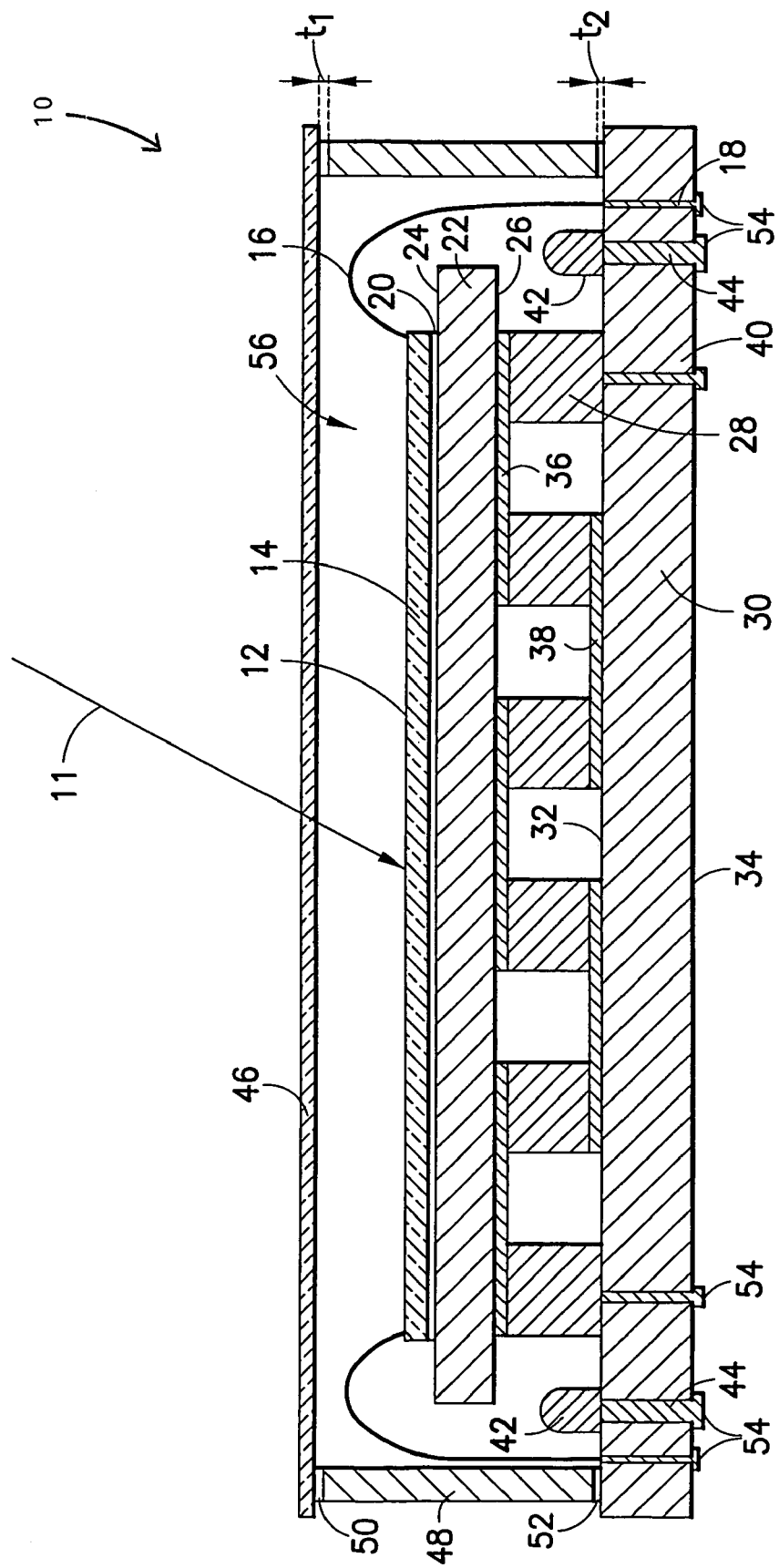
FIG. 1 is a cross section view of an uncooled radiation detector in accordance with the preferred embodiment.

A preferred embodiment of a radiation detector 10 according to the preferred embodiment of the present invention is shown in cross section at FIG. 1. Incident radiation 11 is sensed at an incident surface 12 of a radiation sensor such as a focal plane array (FPA) 14. A plurality of bondwires 16 electrically connect the FPA 14 to a corresponding plurality of FPA feedthroughs 18, detailed below. The FPA 14 may be mounted via a bonding agent 20 to an upper stage surface 24 of a ceramic stage 22. Opposing the upper stage surface is a lower stage surface 26. A plurality of TE cooling elements 28 are disposed between the ceramic stage 22 and a base 30, wherein the base 30 defines an upper base surface 32 that faces the TE cooling elements 28 and an opposing lower base surface 34.

The TE cooling elements 28 are electrically interconnected in series through upper serial conductors 36 and lower serial conductors 38. The upper serial connectors 36 are disposed on the lower stage surface 26, and the lower serial connectors 38 are disposed on the upper base surface 32 such that the TE cooling elements 28 are sandwiched between the ceramic stage 22 and the base 30. Each TE cooling element 28 at the end of the series of elements is electrically connected to a TE element feedthrough 40. A getter 42 is disposed within the detector 10 and electrically connected to at least a pair of getter feedthroughs 44.

Each of the feedthroughs 18, 40, 44 recited above is formed as one or more filled vias passing from the upper base surface 32 to the lower base surface 34. The vias are preferably filled and sealed with a conductive material such as tungsten, gold, copper or aluminum. Alternatively, they may be filled with a conductive wire, such as an extension of a bondwire 16, and sealed with an electrically insulating material. In either instance, each feedthrough 18, 40, 44 defines a conductive pathway through the via. Additionally, the feedthroughs 18, 40, 44 are sealed to pressure differentials between the base upper surface 32 and the base lower surface 34. Preferably, the vias are also sealed against moisture penetration in the presence of the above pressure differentials. Extending from each of the feedthroughs 18, 40, 44 and extending beyond the lower base surface 34 is a conductive pad 54, preferably gold, for electrical interconnect with apparatus external to the detector 10. Alternatively, brazed pins may be used.

A window 46 overlies the FPA 14 in such a manner as to define a space or gap therebetween. The window 46 is transparent to incident radiation 11 that is sensed at the FPA 14, such as IR radiation in this preferred embodiment. The window 46 is preferably germanium, but may also be silicon, zinc selenide, calcium fluoride, or any of the various IR window materials known in the art. The window 46 may optionally include a bandpass filter which absorbs or reflects incident radiation 11 except that of a narrow wavelength band, wherein the narrow wavelength band of radiation is that intended to be sensed at the FPA. Incident radiation within the selected wavelength band passes through the window 46 and into the detector 10. The window 46 is supported in spaced relation over the FPA 14 by a frame 48. The frame 48 may be made in one part with the base 30, but preferably the frame 48 is a separate component that is assembled with other components to form the detector 10. Preferably, the base 30, ceramic stage 22, and frame 48 are made of aluminum nitride or alumina ($Al_2O_3$) for good thermal conductivity and high heat dissipation, though many ceramic materials known in the art are appropriate. The base 30, ceramic stage 22, and frame 48 need not be made of the same material. A heat activated sealant material, such as a first solder layer 50, lays between the window 46 and the frame 48. Similarly, another heat activated sealant material, such as a second solder layer 52 lies between the frame 48 and the base 30. Then first 50 and the second 52 solder layer may be of the same material. A vacuum chamber 56 is defined by the window 46, the frame 48, the base 30, and the first and second solder layers 50 and 52, respectively. The embodiment of FIG. 1 disposes the FPA 14 together with the TE cooling elements 28 within the vacuum chamber 56.

The solder layers 50, 52 are preferably each formed from a solder pre-form, described below, that is liquefied during final sealing of the detector and solidified upon returning to standard atmospheric temperature and pressure. Preferably, the first 50 and second 52 solder layers are each an alloy of indium or gold. The first solder layer 50 defines a thickness $t_1$ and the second solder layer 52 defines a thickness $t_2$, preferably each thickness less than about 0.007 inches. In a most preferred embodiment, the first 50 and second 52 solder layers are each made of the alloy $In_{70}Pb_{30}$, and define a thickness $t_1=t_2=0.001$ inches +/−0.0005 inches. In certain embodiments, the first solder layer 50 may be of a different material and/or define a different thickness than the second solder layer 52.

During final sealing of the detector 10, an electric current is passed through each getter 42 by means of conductive material disposed in the getter feedthroughs 44. This causes resistive heating, and current is controlled to bring the getters 42 to a pre-determined activation temperature. It is preferable to activate the getters 42 prior to final sealing of the detector 10 to remove from the vacuum chamber 56 the substantial off-gasses generated during activation of the getter 42. Off-gasses that remain within the vacuum chamber 42 would be adsorbed onto the getters 42, diminishing their capacity to scavenge from within the vacuum chamber 56 during the life of the detector 10. The getters are typically activated while in a low-pressure enclosure such as a low pressure-processing chamber (described below) during final sealing of the detector 10. The feedthroughs 18, 40, 44 are preferably defined by the base 30, but some or all of the feedthroughs 18, 40, 44 may alternatively be defined by the frame 48 or any other component of the detector 10 that itself defines the vacuum chamber 56 in which the FPA 14 is disposed.

It is known in prior art detector designs to dispose the TE elements 28 outside of the vacuum chamber 56 for two reasons. During operation of the detector 10, TE elements 28 tend to off-gas within the low pressure of the vacuum chamber 56. Also, heat is more efficiently dispersed from the TE elements 28 when they are located outside of the vacuum chamber 56. However, in conditions of high humidity, or when temperatures external of the vacuum chamber 56 are near the dew point, heat from the TE elements 28 can cause condensation to form in the area of the TE elements 28 as well as in the area of the window 46. Window condensation scatters incident radiation 11 before it enters the vacuum chamber 56, thereby imposing erroneous signals to the FPA 14. The preferred embodiment of the present invention disposes the TE cooling elements 28 within the vacuum chamber 56 to reduce condensation on the window 46 and to reduce the power consumption requirements of the TE cooler 28. More cooling power is required due to increased conductive heat transfer on the TE elements 28 that are eliminated when the TE elements are within a vacuum. A larger getter 42 (e.g.: more getter material or more efficient getter material) is employed to account for the additional heat of off-gasses from the TE elements 28 situated within the vacuum chamber 56, as opposed to a detector 10 with TE elements 28 external of the vacuum chamber 56.

During operation, incident radiation 11 passes through the window 46 and impinges the incident surface 12 of the FPA 14, heating portions of the FPA 14. This heat is converted to electrical signals, which are transferred from the FPA 14 through the bondwires 16 and the conductive material disposed in the FPA feedthroughs 18 to the conductive pads 54 associated with the FPA feedthroughs 18. Current is applied to those conductive pads 54, which passes through the TE cooling elements 28 that are preferably arranged in electrical series and thermal parallel. In this manner, the TE elements 28 draw away heat generated by the FPA 14 or heat built up within the vacuum chamber 56 by any other means (i.e.: conduction through the detector, radiation of a wavelength not sensed by the FPA). This excess heat is dispersed through the base 30.

Alternatively, the TE cooling elements 28 may be reverse biased to apply heat to the FPA 14. This can be done alternately with cooling so that heating and cooling are provided in response to a temperature control circuit (not shown). With this technique, the temperature of the FPA 14 can be maintained stable to within 0.001° C. or less for proper operation of uncooled thermal sensors.

Figure 2:
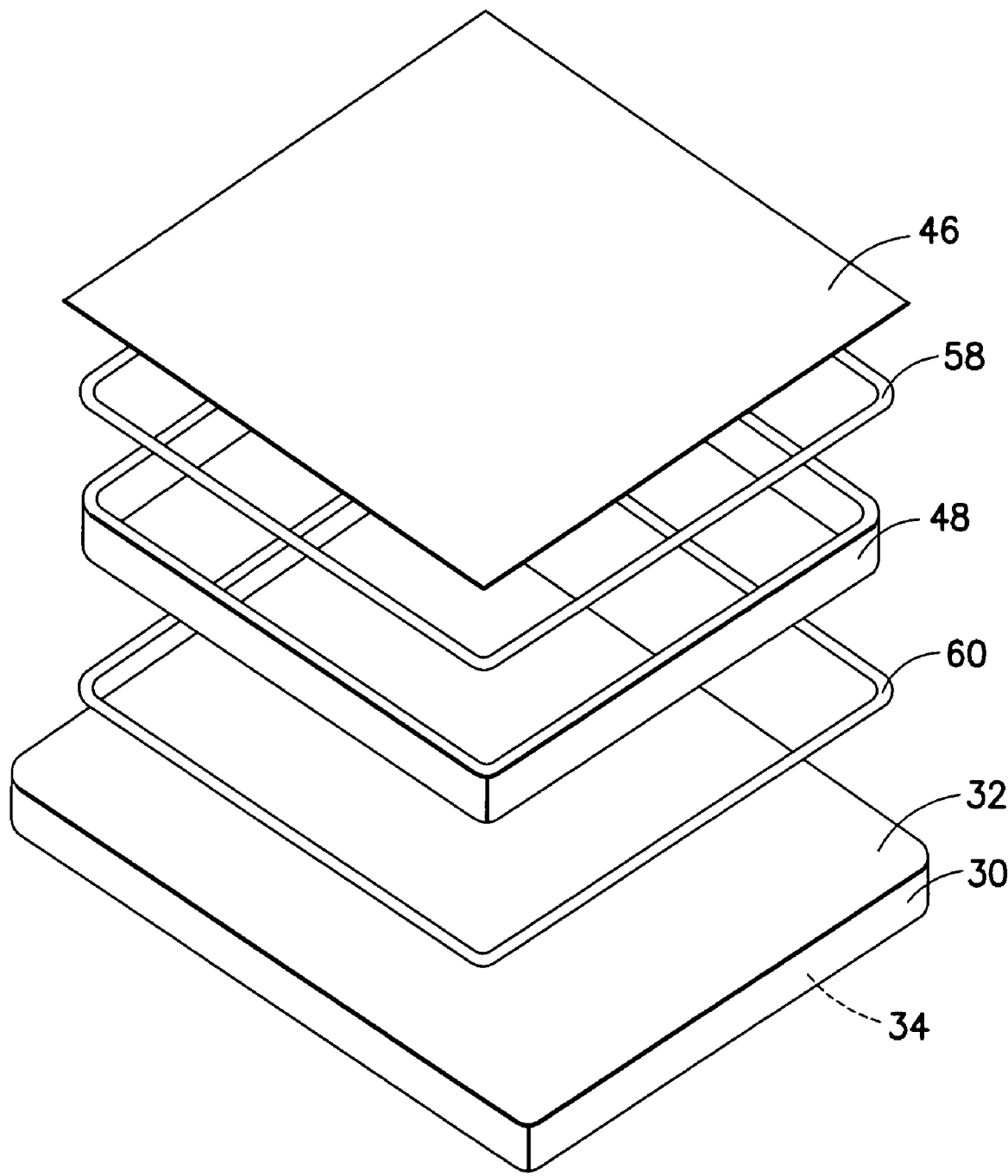
FIG. 2 is an exploded view of the housing components in accordance with the preferred embodiment.

FIG. 2 is an exploded view of the components that define the vacuum chamber 56. Other components, such as the FPA 14, TE elements 28, ceramic stage 22, etc. are not illustrated in FIG. 2 for clarity, but are preferably substantially as shown in FIG. 1. The base 30, frame 48 and window 46 are as described in reference to FIG. 1. A first solder pre-form 58 is disposed between the window 46 and the frame 48. A second solder pre-form 60 is disposed between the frame 48 and the base 30. Each of the solder pre-forms 58, 60 defines a shape complementary to an adjacent housing components. In the embodiment of FIG. 2, each of the solder pre-forms defines a shape complementary to the frame 48. The first solder layer 50 (FIG. 1) results from the first solder pre-form 58, and the second solder layer 52 (FIG. 1) results from the second solder pre-form 60, so that the materials described above in reference to the solder layers 50, 52 apply to the solder pre-forms 58, 60. Each solder pre-form 58, 60 defines a thickness >0.001 inches, and preferably each defines a thickness ~0.007 inches for durability during handling while avoiding excessive solder overflow during final sealing of the detector. The first solder pre-form 58 need not define a thickness identical to that of the second solder pre-form 60. Alternative to the solder pre-forms 58, 60, one or more solder pastes may be used so that a layer of solder paste disposed on either the frame 48, the window 16, or the base 30 replaces or augments the first 58 and/or the second 60 solder pre-forms depicted in FIG. 2. In the prior art, the vacuum chamber 56 is evacuated through a seal port after the components that define the vacuum chamber 56 are assembled, typically via a welding or a solder re-flow process executed at atmospheric pressure and temperature. The final step in sealing these prior art detectors is plugging the seal port. The solder pre-forms 58, 60 allow final sealing of the detector 10, to be accomplished in a single step within a low pressure processing chamber, described below. The above advantage additionally facilitates batch processing to further lower manufacturing costs.

The present invention includes a method of making a radiation sensing device such as a detector 10. The method is described with reference to FIGS. 3 and 4. In a preferred embodiment of the method, a lower detector assembly 62 is fabricated wherein the FPA 14, the bondwires 16, the TE elements 28, and the (not yet activated) getters 42 are all assembled onto the base 30; the various feedthroughs 18, 40, 44 are filled and sealed; and the conductive pads 54 are affixed onto the lower base surface 34. Separately, the first solder pre-form 58 and the second solder pre-form 60 are temporarily fixed to the frame 48. Preferably, the solder pre-forms 58, 60 are pressed onto the frame 48 for proper alignment until final sealing. Alternatively, the first solder pre-form 58 may be temporarily fixed to the window 46 and/or the second solder pre-form 60 may be temporarily fixed to the base 30.

Figure 3:
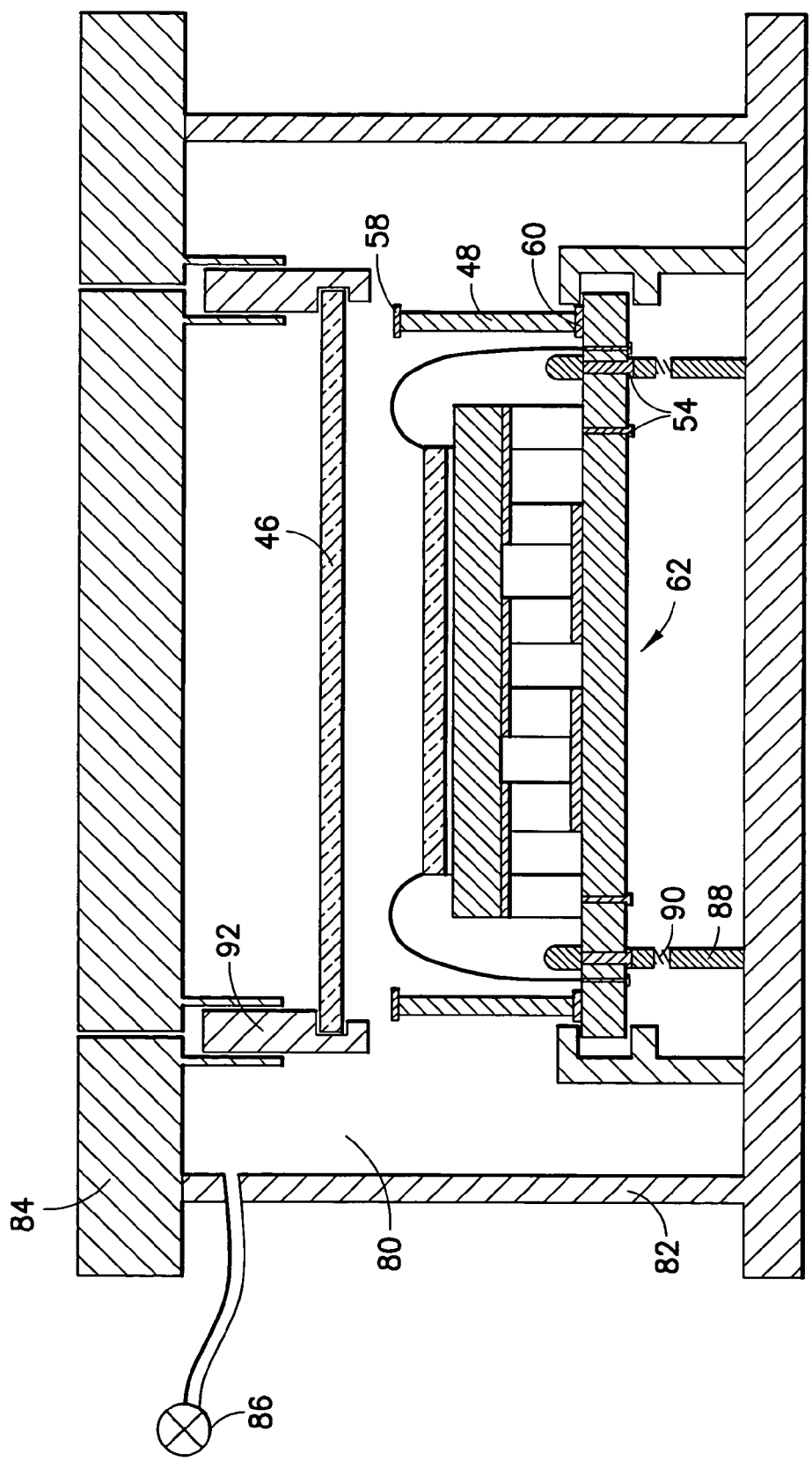
FIG. 3 is a cross section of a detector lower assembly and a window as mounted within a low-pressure processing chamber in accordance with a method of the present invention.
Figure 4:
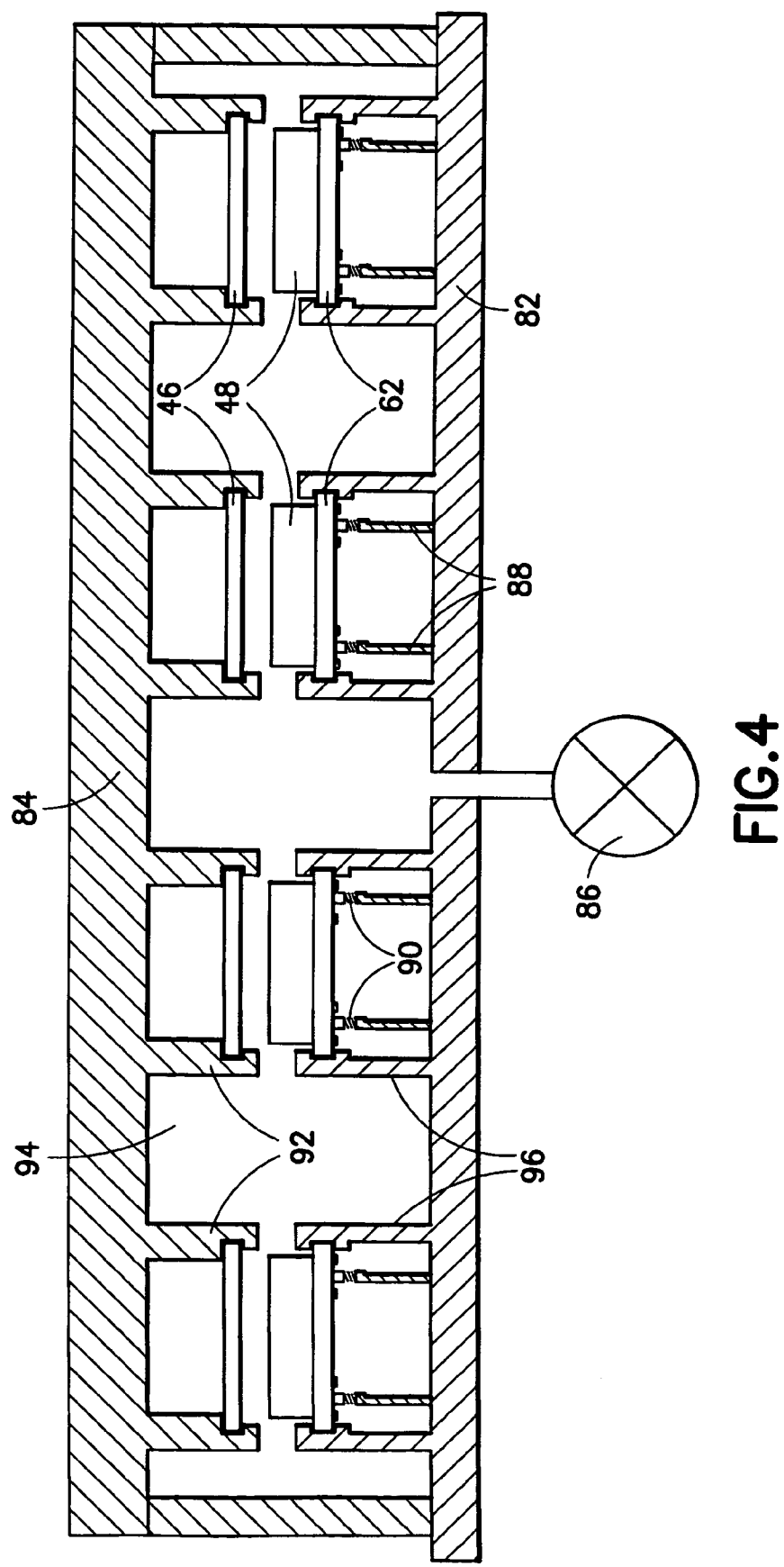
FIG. 4 is similar to FIG. 3, but wherein several detectors are mounted within a single low-pressure processing chamber for batch process manufacturing.

A processing chamber 80 for final sealing of the detector 10 is defined by a processing chamber housing 82 and a processing chamber lid 84. The processing chamber housing 82 and lid 84 are particularly adapted to maintain the lower detector assembly 62, the frame 48, the solder pre-forms 58, 60, and the window 46 in alignment with one another. When the housing 82 and lid 84 are brought together as shown in FIGS. 3 and 4, a vacuum pump 86 draws from within the processing chamber 80 to reduce pressure therein. The processing chamber includes electrical current leads 88, preferably with biasing means 90, for contact with the conductive pads 54 associated with the getters 42 of the lower detector assembly 62. Supports 96 secure the lower detector assembly 62 in a fixed position relative to the processing chamber housing 82 for proper alignment during final sealing. The processing chamber lid 84 includes extensible arms 92 for moving the window 46 from a retracted position to an extended position. The retracted position is that position wherein the window 46 is spaced from the frame 48 and first solder pre-form 58 when the processing chamber lid 84 and housing 82 are brought together, and is shown in FIGS. 3 and 4. The extended position is that position wherein the window 46 contacts the first solder pre-form 58 or the frame 46. The extensible arms 92 extend away from the lid 84 by pneumatic, hydraulic or mechanical means.

The lower detector assembly 62 is secured within the processing chamber 80. The frame 48, with the first 58 and second 60 solder pre-forms temporarily fixed thereto, is placed on the lower detector assembly 62. The window 46 is secured to the extensible arms 92, and the lid 84 is brought into contact with the housing 82 to enclose the processing chamber 80. Preferably, temperature within the processing chamber is raised to a point below the melting point of the solder pre-forms 58 and 60 for a predetermined time period, referred to as a vacuum bake. As used herein, melting point is the temperature at which a solid first changes to a liquid at a given pressure. This vacuum bake removes contaminants such as organic elements and/or high vapor pressure elements prior to final sealing of the detector 10. Heating to the above temperature below the solder pre-form melting point is termed the first heat-up ramp. Where the first and second pre-forms 58, 60 are of different materials defining different melting points, the highest temperature of the first heat-up ramp is determined by the lower of the two melting points.

Once the vacuum bake is completed, pressure within the processing chamber 80 is brought to the desired pressure of the detector vacuum chamber 56 (if not already done so), typically less than about $1 \times 10^{-5}$ torr to prevent the formation of oxides from interfering with the solder wetting process, described below. The extensible arms 92 remain in the retracted position as illustrated in FIG. 3. Electric current is then applied to the getters 42 through the current leads 88, which remain in contact with the conductive pads 54 associated with the getters 42 via biasing means 90. Off-gasses from the getters 42 are drawn out of the processing chamber 80 by the pump 86. When substantially all of the off-gasses from the getters 42 are so removed from the processing chamber 80, current is shut off and temperature within the processing chamber is raised according to a second heat-up ramp, typically no more than about 10–20° C./min for solders of Indium and lead. The second heat-up ramp is limited by the ability of the detector components to absorb heat, and the observed propensity of the solder pre-forms 58, 60 to forcibly discharge, or 'spit', balls of solder material when the solder material is heated too rapidly. The second heat-up ramp raises the temperature within the processing chamber 80 to approximately 35–50° C. above the melting point of the first and second solder pre-forms 58, 60. Where the first and second solder pre-forms 58, 60 are of different materials defining different melting points, the highest temperature of the second heat-up ramp is at least 35° C. above the higher of the two melting points.

The solder is wetted during the second heat-up ramp, which is an important step in assuring a hermetic final seal of the detector 10. As used herein, hermetic seal indicates a seal that is airtight under conditions of temperature and pressure to which the detector may be reasonably exposed. Proper wetting is the driving force behind the minimum high temperature of the second heat-up ramp. During wetting, gases are released from the first and/or second solder pre-forms 58, 60. The window is not brought into contact with the (now wetted) first solder pre-form 58 until a time delay has elapsed after reaching the minimum high temperature of the second heat-up ramp in order for those released solder gasses to be drawn out of the processing chamber by the pump 86. Once the time delay has elapsed, the extensible arms 92 move from the retracted position to the extended position, abutting the window 46 against the (wetted) first solder pre-form 58. While the weight of the frame 48 maintains contact between the frame 48, the second solder pre-form 60, and the base 30, pressure exerted by the extensible arms 92 through the window 46 pressed the frame 48 firmly against the base 30. In this manner, both the (wetted) first and second solder pre-forms 58, 60 are squeezed into the first and second solder layers 50, 52, respectively, in the sealed detector 10.

Once the extensible arms 92 press the components of the detector 10 together, temperature within the processing chamber 80 is reduced as fast as possible to prevent the formation of intermetallics in the solder and to limit the time the detector 10 is exposed to such high temperatures. The rate of temperature reduction may be increased by various means, such as passing water through coils that pass through the processing chamber, and/or introducing a thermal transfer gas such as nitrogen into the processing chamber. Pressure within the processing chamber 80 is raised to atmospheric pressure and the lid 84 can be removed. A detector made according to the method described will have a pressure within the vacuum chamber that is substantially equal to sealing pressure of the processing chamber, the sealing pressure being that pressure within the processing chamber at the time the base 30, frame 48, and window 46 were joined by the solder layers 50, 52 to form the vacuum chamber.

By the above method, numerous steps in the final sealing of a detector 10 may be performed in situ within a processing chamber 80, and with less time within the processing chamber 80, than previous methods that used multiple steps within and outside of such a chamber 80. Because all the above steps are performed within a processing chamber 80, the method of the present invention dispenses with several cleaning steps necessitated by prior art methods, and further allows an advantageous vacuum bake prior to sealing that was not possible earlier.

Additionally, the above method allows a batch-processing chamber 94 to be sized and particularly adapted to process multiple detectors 10, as is illustrated in FIG. 4. Each of the detectors 10, including the lower detector assemblies 62, the frames 48, the windows 46, and the first 58 and second 60 solder pre-forms are positioned and processed substantially as described with reference to FIG. 3, except a plurality of detectors 10 are processed and finally sealed simultaneously within a single batch processing chamber 94. As compared to prior art methods, this represents a drastic improvement in manufacturing efficiency. It is further expected that reliability will improve, wherein fewer detectors 10 made by the above method will be rejected for lack of vacuum chamber 56 hermeticity than were rejected by prior art methods.

The present method is not limited to that exactly described above and depicted in the associated Figures. For example, the lower detector assembly 62 may be mounted in an inverted position within the processing chamber 80, 94. In this arrangement, the frame 48 may be supported on the window 46 prior to the components being brought together, and either the window/frame combination may be moved into contact with the lower detector assembly 62, or the lower detector assembly 62 may be moved into contact with the window/frame combination. Additionally, the current leads 88 may be retractable and not maintain contact with the conductive pads. Specific temperatures and pressures recited herein are by example only for the given materials and context in which they are described. Where a different solder material, window material, or ceramic material is used, various changes to the temperatures and pressures in the method and in the detector will be dictated at least in part by the specific material, and are hereby explicitly stipulated as within ordinary skill in the art. Various adaptations such as those above, as well as any other changes to the detector or to the method that are within ordinary skill in the art, are deemed to be within the present invention and are not herein dedicated to the public. All examples herein are stipulated as illustrative and not exhaustive. Where temperature is used in reference to the method, temperature is taken in the context of pressure (i.e.: melting temperature within a processing chamber at $1 \times 10^{-5}$ torr may differ from melting temperature at atmospheric pressure for a given material). The ensuing claims are to be interpreted commensurate with each of the above provisions.

What is claimed is:

1. A method of making a radiation detector comprising:
   assembling a lower detector assembly;
   enclosing the lower detector assembly, a window, and a first solder entity within a processing chamber such that the window is spaced from the lower detector assembly;
   reducing pressure within the processing chamber;
   increasing temperature within the processing chamber;
   maintaining a spaced relation between the window and the lower detector assembly until the first solder entity reaches a melting point;
   moving at least one of the window and the lower detector assembly into contact with one another for forming a hermetically sealed compartment using the interposed first solder entity; and
   equalizing pressure between the processing chamber and external of the processing chamber while maintaining the reduced pressure within the hermetically sealed compartment.

2. The method of claim 1 wherein assembling a lower detector assembly comprises:
   disposing a plurality of TE elements, a ceramic stage, a radiation sensor, and a getter all in fixed relation to the base, and
   electrically connecting the sensor, the getter, and at least two TE elements to associated conductive pathways that pass through feedthroughs, each feedthrough being defined by the base.

3. The method of claim 1 further comprising reducing the temperature within the processing chamber after moving at least one of the window and the lower detector assembly into contact with one another.

4. The method of claim 3 wherein reducing the temperature within the processing chamber is characterized by an average rate of temperature reduction that is greater than 20° C. per minute.

5. The method of claim 1 wherein increasing temperature within the processing chamber includes raising the temperature according to a first and a second heat-up ramp.

6. The method of claim 5 wherein the second heat-up ramp raises temperature within the processing chamber no more than 20° C. per minute.

7. The method of claim 5 wherein the maximum temperature of the first heat-up ramp is below a melting temperature of the first solder entity, and the maximum temperature of the second heat-up ramp is at least above the melting temperature of the first solder entity.

8. The method of claim 1 wherein enclosing the lower detector assembly, a window, and a first solder entity within a processing chamber includes also enclosing a frame and a second solder entity within the processing chamber, and further wherein the frame is spaced from one of the lower detector assembly or the base.

9. The method of claim 8 wherein the first and second solder entities each comprise a solder pre-form.

10. The method of claim 8 wherein the first and second solder pre-forms are temporarily fixed to the frame by a press.

11. The method of claim 1 wherein maintaining a spaced relation between the window and the lower detector assembly includes activating the getter by resistive heating prior to reaching a melting point of the first solder entity.

12. The method of claim 1 as applied to at least two detectors, both detectors being simultaneously subjected to varying pressures and temperatures within a single processing chamber.

* * * * *